United States Patent
Oshima et al.

(10) Patent No.: US 11,694,894 B2
(45) Date of Patent: Jul. 4, 2023

(54) CRYSTALLINE FILM CONTAINING A CRYSTALLINE METAL OXIDE AND METHOD FOR MANUFACTURING THE SAME UNDER PARTIAL PRESSURE

(71) Applicant: FLOSFIA INC., Kyoto (JP)

(72) Inventors: Yuichi Oshima, Ibaraki (JP); Katsuaki Kawara, Kyoto (JP)

(73) Assignee: FLOSFIA INC., Kyoto (JP)

(*) Notice: Subject to any disclaimer, the term of this patent is extended or adjusted under 35 U.S.C. 154(b) by 25 days.

(21) Appl. No.: 17/239,986

(22) Filed: Apr. 26, 2021

(65) Prior Publication Data

US 2021/0335609 A1 Oct. 28, 2021

(30) Foreign Application Priority Data

Apr. 24, 2020 (JP) .................... 2020-077066
Apr. 24, 2020 (JP) .................... 2020-077069

(51) Int. Cl.
*H01L 21/02* (2006.01)
*H01L 29/04* (2006.01)
(Continued)

(52) U.S. Cl.
CPC ........ *H01L 21/02565* (2013.01); *C30B 25/04* (2013.01); *C30B 25/18* (2013.01); *C30B 29/16* (2013.01); *H01L 21/0242* (2013.01); *H01L 21/0243* (2013.01); *H01L 21/0262* (2013.01); *H01L 21/02609* (2013.01);
(Continued)

(58) Field of Classification Search
CPC ........... H01L 21/02565; H01L 21/0242; H01L 21/0243; H01L 21/02609; H01L 21/0262; H01L 29/045; H01L 29/24; H01L 29/7869; H01L 21/02414; H01L 21/02433; H01L 21/02573; H01L 21/02639; C30B 25/04; C30B 25/18; C30B 29/16; H02M 3/33573; H02M 3/33576

See application file for complete search history.

(56) References Cited

U.S. PATENT DOCUMENTS

2019/0057865 A1* 2/2019 Oshima ............... H01L 21/0242
2022/0059424 A1* 2/2022 Hashigami ........ H01L 21/02483
2022/0157946 A1* 5/2022 Fukui .................. H01L 21/0262

FOREIGN PATENT DOCUMENTS

JP 5343224 11/2013
JP 5397794 1/2014
(Continued)

OTHER PUBLICATIONS

Y. Oshima et al., "Epitaxial Lateral Overgrowth of α-Ga$_2$O$_3$ by Halide Vapor Phase Epitaxy", APL Mater. 7, 022503 (2019), pp. 7.022503-7.022503-6; https://doi.org/10.1063/1.5051058.
(Continued)

*Primary Examiner* — John P. Dulka
(74) *Attorney, Agent, or Firm* — Wenderoth, Lind & Ponack, L.L.P.

(57) ABSTRACT

A high-quality crystalline film having less impurity of Si and the like and useful in semiconductor devices is provided. A crystalline film containing a crystalline metallic oxide including gallium as a main component, wherein the crystalline film includes a Si in a content of $2\times10^{15}$ cm$^{-3}$ or less.

21 Claims, 11 Drawing Sheets

(51) Int. Cl.
H01L 29/24 (2006.01)
C30B 25/04 (2006.01)
C30B 25/18 (2006.01)
C30B 29/16 (2006.01)
H02M 3/335 (2006.01)

(52) U.S. Cl.
CPC ............ *H01L 29/045* (2013.01); *H01L 29/24* (2013.01); *H02M 3/33573* (2021.05); *H02M 3/33576* (2013.01)

(56) References Cited

FOREIGN PATENT DOCUMENTS

| | | | | |
|---|---|---|---|---|
| JP | 5397795 | | 1/2014 | |
| JP | 2014-072533 | | 4/2014 | |
| JP | 2016-098166 | | 5/2016 | |
| JP | 2016-100592 | | 5/2016 | |
| JP | 2016-100593 | | 5/2016 | |
| JP | 2016-155714 | | 9/2016 | |
| JP | 2016155714 A | * | 9/2016 | ........... B29C 64/135 |
| JP | 2019-034883 | | 3/2019 | |
| WO | 2014/050793 | | 4/2014 | |

OTHER PUBLICATIONS

K. Kaneko, "Growth and Physical Properties of Corundum-Structured Gallium Oxide Alloy Thin Film", Thesis, Mar. 25, 2013, Kyoto University, Kyoto University Research Information Repository, https://doi.org/10.14989/doctor.k17573, pp. 1-116, with English Abstract.

* cited by examiner

CRYSTALLINE FILM CONTAINING A CRYSTALLINE METAL OXIDE AND METHOD FOR MANUFACTURING THE SAME UNDER PARTIAL PRESSURE

TECHNICAL FIELD

The disclosure relates to a crystalline film and a method of manufacturing the same useful for a semiconductor device.

BACKGROUND

As a next-generation switching device capable of realizing high withstand voltage, low loss, and high heat resistance, a semiconductor device using gallium oxide ($Ga_2O_3$) having a large band gap is attracting attention, and application to power semiconductor devices such as inverters is expected. Due to its wide band gap, wide range of applications as light receiving and receiving devices such as LEDs and sensors is also expected. In particular, band gap of $\alpha$-$Ga_2O_3$ having the corundum structure among gallium Oxides can be controlled by making mixed crystal together with indium or aluminum, respectively or in combination. Gallium oxide constitutes an extremely attractive material system as a InAlGaO based semiconductor. Here, InAlGaO based semiconductor indicates a $In_xAl_yGa_zO_3$ ($0 \leq X \leq 2$, $0 \leq Y \leq 2$, $0 \leq Z \leq 2$, $X+Y+Z=1.5$ to $2.5$), and can be viewed as the same material system including gallium Oxide.

However, since the most stable phase of gallium oxide has the $\beta$-Gallia structure, a special deposition method must be applied in order to form a crystal film having the corundum structure of a metastable phase. Also, since the $\alpha$-$Ga_2O_3$ with the corundum structure is a metastable phase, the bulk-substrate with the melt-crystal growth structure is not applicable. For this reason, sapphire substrate having the same structure as $\alpha$-$Ga_2O$ is used. However, since $\alpha$-$Ga_2O_3$ a and sapphire have a large degree of lattice-mismatch, $\alpha$-$Ga_2O_3$ crystal films heteroepitaxially grown on sapphire substrates tend to have high dislocation densities. In addition to the issues of the crystal film having the corundum structure, there are other issues such as improvement of the deposition rate and crystal quality, suppression of cracks and abnormal growth, suppression of twin, and cracking of substrates due to warpage. Under such circumstances, several studies have been conducted on the deposition of a crystalline semiconductor having the corundum structure.

Japanese Patent No. 5397794 discloses a method for manufacturing an oxide crystal thin film by a mist CVD method using bromide or iodide of gallium or indium. Japanese Patent No. 5343224, Japanese Patent No. 5397795, and Japanese Patent Application Publication No. 2014-72533 disclose a multilayer structure in which a semiconductor layer having the corundum-type crystal structure and an insulating film having the corundum-type crystal structure are formed on a base substrate having the corundum-type crystal structure.

As in Japanese Patent Application Publication No. 2016-100592, Japanese Patent Application Publication No. 2016-98166, and Japanese Patent Application Publication No. 2016-100593, deposition by mist CVD has also been studied using an ELO (Epitaxial Lift-Off) substrate or void formation. These methods, however, are yet satisfied in terms of deposition rate. A deposition method in which deposition rate is improved has been desired.

Japanese Patent Application Publication No. 2016-155714 discloses that gallium oxide having the corundum structure is deposited by a HVPE (Hydride Vapor Phase Epitaxy) method using a gallium raw material and an oxygen raw material. However, since the $\alpha$-$Ga_2O_3$ is a metastable phase, it is difficult to deposit a film like the $\beta$-$Ga_2O_3$. There still exists issues to be solved for the purpose in industrial use. In addition, U.S. Patent Application Publication No. 2019/0057865 and Japanese Patent Application Publication No. 2019-034883 disclose that ELO crystal growth is performed using PSS (Patterned Sapphire Substrate) to obtain a crystalline film having a surface area of 9 μm2 or more and a dislocation density of $5 \times 10$ $cm^{-2}$. However, in order to fully exhibit the performance of gallium oxide for the use of a power device, in addition to dislocation densities, impurity such as Si needs to be reduced, that is, the content of Si needs to be reduced to $1 \times 10^{16}$ $cm^{-3}$ or less. A method of manufacturing a crystalline film with fewer impurities is desired.

SUMMARY

An object of the disclosure is to provide a high-quality crystalline film useful for semiconductor devices and the like, and a manufacturing method capable of manufacturing such crystalline film in an industrially advantageous manner.

As a result of intensive studies to achieve the above object, the inventors obtained a crystalline film having Si content of less than or equal to $2 \times 10^{15}$ $cm^{-3}$, when forming a $Ga_2O_3$ at a partial pressure of 1 kPa or more using a $GaCl_3$.

It has been found that such a crystalline film can solve the above problems.
In other words, embodiments of the disclosure are as follows.

[1] A crystalline film containing a crystalline metallic oxide including gallium as a main component, wherein the crystalline film includes a Si in a content of $2 \times 10^{15}$ $cm^{-3}$ or less.

[2] The crystalline film according to [1], wherein the crystalline metal oxide has the corundum structure.

[3] The crystalline film according to [1] or [2], wherein the content of C is $5 \times 10^{16}$ $cm^{-1}$ or less.

[4] The crystalline film according to any one of [1] to [3], wherein the thickness of the crystalline film is 10 μm or more.

[5] The crystalline film according to any one of [1] to [4], wherein the thickness of the crystalline film is 25 μm or more.

[6] The crystalline film according to any one of [1] to [5], wherein the surface area of the crystalline film is 10 $cm^2$ or more.

[7] The crystalline film according to any one of [1] to [6], wherein the crystalline film is a semiconductor film.

[8] A semiconductor device including the crystalline film according to any one of [1] to [7].

[9] The semiconductor device according to [8], wherein the semiconductor device is a power device.

[10] A semiconductor system including the semiconductor device according to [8] or [9].

[11] A method for manufacturing a crystalline film for depositing a crystalline film on a substrate by crystal growth from a raw material, wherein the raw material contains $GaCl_3$, and wherein the crystal growth is performed under a condition in which a partial pressure of the raw material is 1 kPa or more and an atmosphere containing oxygen.

[12] The manufacturing method according to [11], wherein the crystal-growth is performed out by a HVPE method.

[13] The manufacturing method according to [11] or [12], wherein the crystal growth is performed at a deposition rate of 90 μm/hour or more.

[14] The manufacturing method according to any one of [11] to [13], wherein the crystal growth is performed under a temperature of 400° C. to 700° C.

[15] The manufacturing method according to any one of [11] to [14], wherein the crystal growth is performed by forming an unevenness portion including concavities and/or convexities portion on the substrate directly or via another layer, and then forming the crystalline film on the unevenness portion.

[16] The manufacturing method according to any one of [11] to [15], wherein the unevenness portion is formed by arranging a mask regularly or on the substrate directly or via another layer.

[17] The manufacturing method according to any one of [11] to [16], wherein the substrate is a sapphire substrate.

[18] The manufacturing method according to any one of [11] to [17], wherein the crystalline film is a crystalline oxide film.

[19] The manufacturing method according to [18], wherein the crystalline oxide film includes a crystal or a mixed crystal of $Ga_2O_3$.

[20] The manufacturing method according to [18] or [19], wherein the crystalline oxide film has the corundum structure.

The crystalline film according to an embodiment of the disclosure includes a high-quality crystal film useful for semiconductor devices and the like. Further, by the method for manufacturing a crystalline film according to an embodiment of the disclosure, a crystalline film can be industrially advantageously obtained.

DETAILED DESCRIPTION

Figure 1:
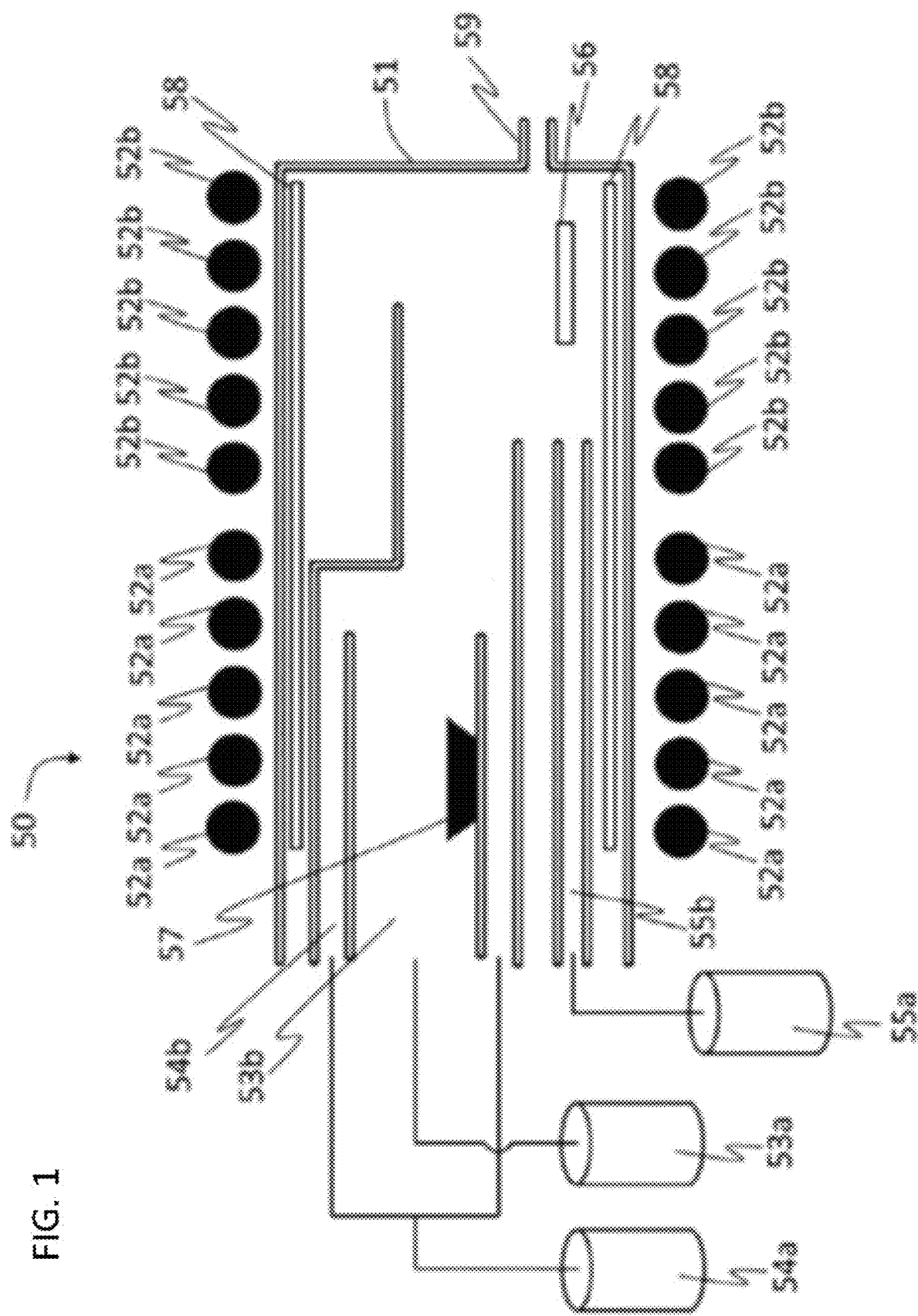
FIG. 1 is a diagram illustrating a HVPE apparatus used in an embodiment of the disclosure.

A crystalline film according to an embodiment of the disclosure contains a crystalline metal oxide including a gallium as a main component, and has a Si content of $2\times10^{15}$ $cm^{-3}$ or less. The content of Si is a value measured by SIMS. In an embodiment of the disclosure, it is preferable that the crystalline metal oxide has the corundum structure. In an embodiment of the disclosure, it is preferable that the content of C is $5\times10^{16}$ $cm^{-3}$ or less. The content of C is a value measured by SIMS. In an embodiment of the disclosure, the thickness of the crystalline film is preferably 10 μm or more, more preferably 25 μm or more. The surface area of the crystalline film is preferably equal to or greater than 10 $cm^2$, and more preferably equal to or greater than 20 $cm^2$. In an embodiment of the disclosure, it is preferable that the crystalline film is a semiconductor film.

Preferred crystalline film described above can be easily obtained by a method for manufacturing a crystalline film for depositing a crystalline film on a substrate by crystal growth from a raw material, wherein the raw material contains $GaCl_3$, and wherein the crystal growth is performed under a condition in which a partial pressure of the raw material is 1 kPa or more and an atmosphere containing oxygen. Hereinafter, a preferred method of manufacturing a crystalline film will be described.

In an embodiment of the disclosure, it is preferable that the crystal growth is performed by a HVPE method. In an embodiment of the disclosure, it is preferable that the crystal growth is performed at a deposition rate of 90 μm/hour or more, and more preferably, the crystal growth condition is performed at a deposition rate of 100 μm/hour or more.

In an embodiment of the disclosure, when the crystal growth is performed by a HVPE method, for example, it is preferable that a partial pressure of a raw material gas (such as a $GaCl_3$ gas and a precursor gas) is set to 1 kPa or more and a partial pressure of an oxygen-containing raw material gas is set to 1.25 kPa or more.

In the embodiment of the disclosure, it is preferable that the crystal growth is performed under an oxygen-containing atmosphere.

(Substrate)

The substrate is usually a crystalline substrate. The crystalline substrate is not particularly limited as long as it is a substrate containing a crystalline substance as a main component, and may be a known substrate. The crystalline substrate may be an insulator substrate, may be a conductive substrate, or may be a semiconductor substrate. The crystalline substrate may be a single crystalline substrate, or may be polycrystalline substrate. Examples of the crystalline substrate include a substrate containing a crystal having the corundum structure as a main component, a substrate containing a crystal having the β-Gallia structure as a main component, and a substrate containing a crystal having the hexagonal crystal structure as a main component. The term "main component" refers to a composition ratio in a substrate containing 50% or more of the crystalline material, preferably 70% or more, and more preferably 90% or more.

Examples of the substrate containing a crystal having the corundum structure as a main component include a sapphire substrate and an α-$Ga_2O_3$ substrate. Substrates containing a crystalline material having the above-described β-Gallia structure as a main component include, for example, a β-$Ga_2O_3$ substrate or a mixed crystalline substrate including a β-$Ga_2O_3$ and a $Al_2O_3$. As a mixed crystalline substrate including a β-$Ga_2O_3$ and a $Al_2O_3$, a mixed crystalline substrate containing $Al_2O_3$ more than 0% and 60% or less atomic ratio is exemplified as a preferred example. The substrate having the hexagonal structure, a SiC substrate, a ZnO substrate, and a GaN substrate, for example. Examples of other crystalline substrates include, for example, Si substrates.

In an embodiment of the disclosure, it is preferable that the crystalline substrate is a sapphire substrate. As the sapphire substrate, c-plane sapphire substrate, m-plane sapphire substrate, and a-plane sapphire substrate can be used, for example. The sapphire substrate may have an off angle. The off angle of the sapphire substrate is not particularly limited, but is preferably 0° to 15°. The thickness of the crystalline substrate is not particularly limited, but is preferably 50 μm to 2000 μm, more preferably 200 μm to 800 μm.

In the embodiment of the disclosure, it is preferable that the unevenness portion having concavities and/or convexities is formed on the crystalline substrate directly or via another layer, and the first crystal layer is formed on the unevenness portion because the crystalline multilayer structure can be obtained more efficiently. The unevenness portion is not particularly limited as long as it is composed of concavities and/or convexities, and may be an unevenness portion composed of concavities or an unevenness portion composed of convexities. The unevenness portion may be formed of regular concavities and/or convexities, or may be formed of irregular concavities and/or convexities. In the embodiment of the disclosure, it is preferable that the unevenness portion is formed periodically, and it is more preferable that the unevenness portion is formed periodically and regularly patterned. The shape of the unevenness portion is not particularly limited, and for example, a stripe shape, a dot shape, a mesh shape, or a random shape can be applied. In the embodiment of the disclosure, a dot shape or a stripe shape is preferable. When the unevenness portions are patterned periodically and regularly, it is preferable that the pattern shape of the unevenness portions is a polygonal shape such as a triangle, a square (such as a rectangle or a trapezoid, and a pentagonal), a hexagon, a circle, an ellipse, or the like. In the case of forming the unevenness portion in a dot shape, the lattice shape of the dot may be a square lattice, an orthorhombic lattice, a triangular lattice, a hexagonal lattice, for example. It is more preferred that the unevenness portion is in a triangular lattice shape. The cross-sectional shape of the concavity or convexity of the unevenness portion is not particularly limited, C-shaped, U-shaped, inverted U-shaped, corrugated, or polygonal shape such as triangular, square (including square, rectangular, or trapezoidal), pentagonal, hexagon or the like, for example.

The constituent material of the convexities is not particularly limited, and may be a known material. The constituent material may of the convexities may be an insulator material, may be a conductive material, or may be a semiconductor material. The constituent material of the convexities may be amorphous, single crystal, or polycrystalline. Examples of the material of the convexities include oxides, nitrides, or carbides such as Si, Ge, Ti, Zr, Hf, Ta, and Sn, carbon, diamond, metal, and mixtures thereof. More specifically, examples include a Si-containing compound containing $SiO_2$, SiN, or polycrystalline silicon as a main component, and a metal having a melting point higher than the crystal growth temperature of the crystalline oxide (a noble metal such as platinum, gold, silver, palladium, rhodium, iridium, or ruthenium, for example). The content of the constituent material is preferably 50% or more, more preferably 70% or more, and most preferably 90% or more, in the convexities at a composition ratio.

The means for forming the convexities may be a known means, for example, photolithography, electron beam lithography, laser patterning, and known patterning means such as subsequent etching (including dry etching or wet etching). In the embodiment of the disclosure, it is preferable that the convexity has a stripe shape or a dot shape, and more preferably a dot shape. In the embodiment of the disclosure, it is also preferable that the crystalline substrate is a PSS (Patterned Sapphire Substrate). The pattern shape of the PSS is not particularly limited, and may be a known pattern shape. The pattern shapes include, for example, conical, bell-shaped, domed, hemispherical, square, or triangular pole shapes. In the embodiments of the disclosure. In an embodiment of the disclosure, it is preferable that the pattern shape is conical.

In an embodiment of the disclosure, the pitch interval of the pattern shape is not particularly limited. In an embodiment of the disclosure, the pitch interval of the pattern shape is preferably 5 μm or less, more preferably 1 μm to 3 μm.

In addition, in the embodiment of the disclosure, it is preferable that the formation of the convexities is performed by forming a mask layer on the crystalline substrate. The mask layer can be suitably formed by forming a constituent material of the mask layer by a known film forming means such as a vacuum evaporation method, a CVD method, or a sputtering method, for example, and then processing the constituent material by the above-mentioned known patterning means. Examples of the constituent material of the mask layer include a material exemplified as a constituent material of the convexities. In an embodiment of the disclosure, when a crystalline layer is manufactured using the mask layer, it is preferable to form multicrystal on the mask layer so that a thicker and wider crystalline oxide layer can be obtained.

The concavities are not particularly limited, but may be the same as or a substrate as the constituent material of the convexities described above. In an embodiment of the disclosure, it is preferable that the concavities are a void layer provided on the surface of the substrate. As the means for forming the concavities, the same means as the means for forming the convexities can be used. The void layer can be formed on the surface of the substrate by providing a groove on the substrate using known groove processing methods. In an embodiment of the disclosure, the void layer can be suitably formed by providing a mask layer by sputtering, for example, and then performing patterning processing using a known patterning processing means such as photolithography. The groove width, groove depth, terrace width, and the like of the void layer are not particularly limited as long as they do not deviate the object of the disclosure, and can be appropriately designed.

Hereinafter, preferred embodiment of a crystalline substrate suitably used in an embodiment of the disclosure will be described with reference to the accompanying drawings.

Figure 2:
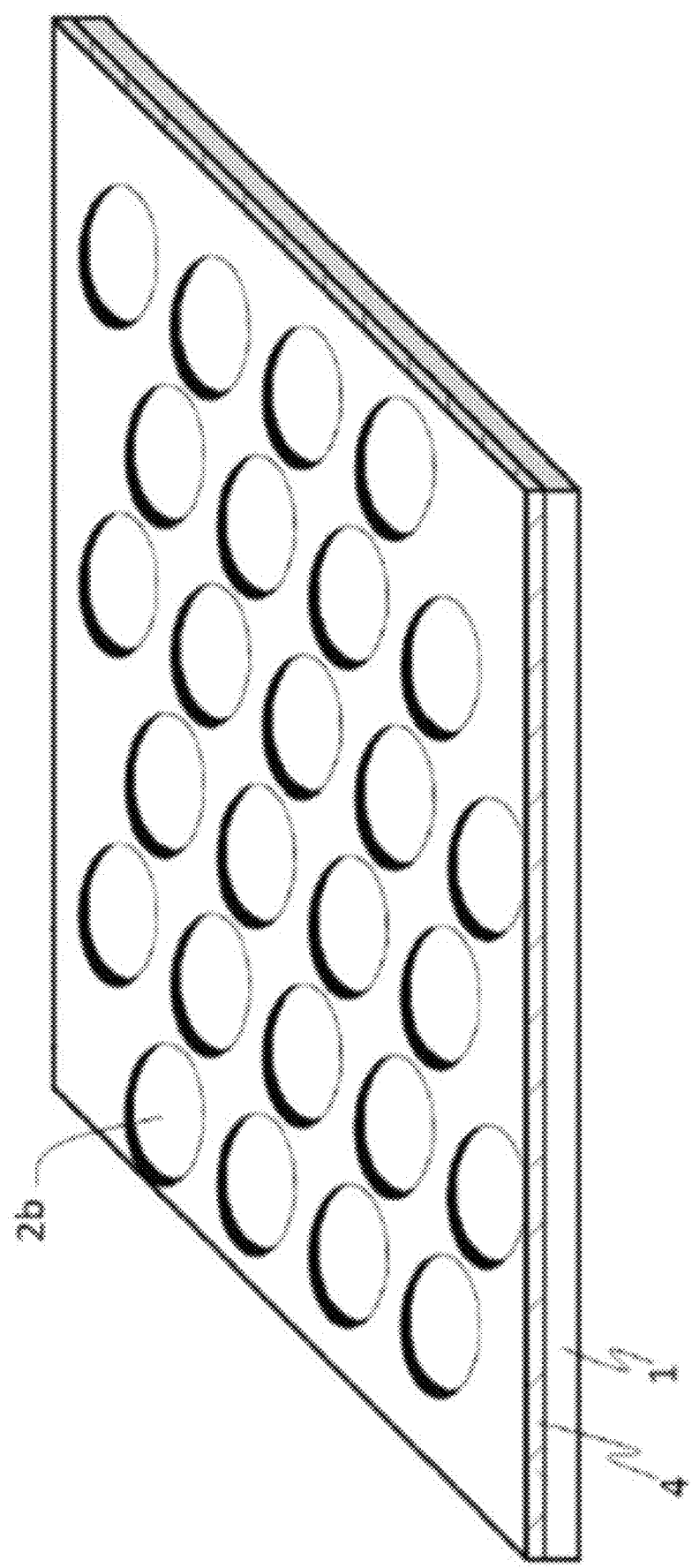
FIG. 2 is a diagram schematically illustrating a surface of an unevenness portion formed on a surface of a substrate used in an embodiment of the disclosure.
Figure 3:
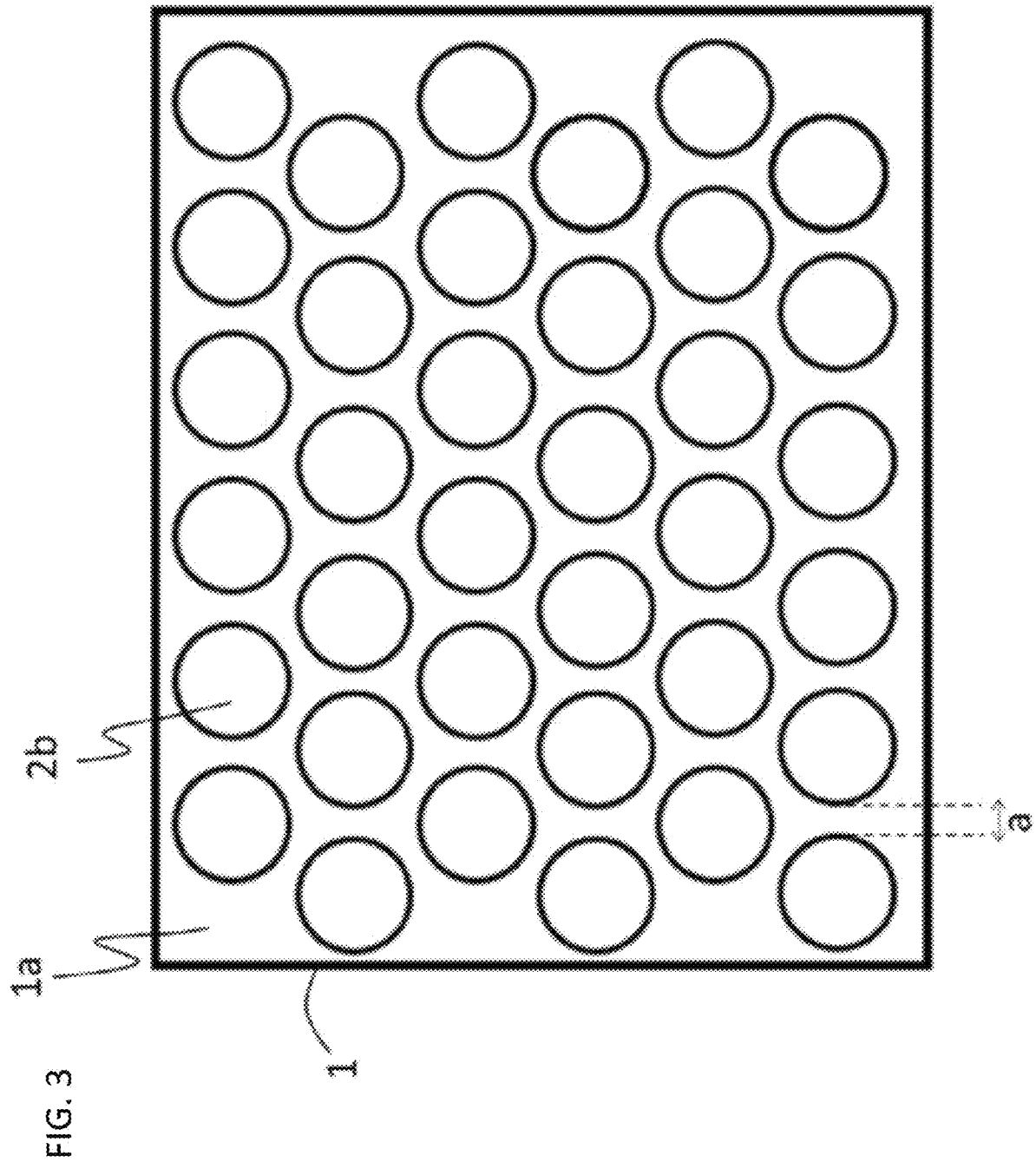
FIG. 3 is a schematic view schematically illustrating a surface of an unevenness portion formed on a surface of a substrate used in an embodiment of the disclosure.

FIG. 2 shows one mode of the unevenness portion provided on the crystal growth surface of the crystalline substrate in an embodiment of the disclosure. Unevenness portion of FIG. 2 includes a crystalline substrate 1 and a mask layer 4. FIG. 3 shows the surface of the unevenness portion shown in FIG. 2 as viewed from the top direction. As can be seen from FIGS. 2 and 3, the mask layer 4 is formed on the crystal growth plane of the crystalline substrate 1, holes are vacant in a dot shape. From the holes of the dots of the mask layer 4 crystalline substrate 1 is exposed, the dot-shaped recess 2b is formed in a triangular lattice shape. The dot circles are provided at intervals of a predetermined period "a". The period "a" is not particularly limited, but is preferably 1 μm to 1 mm, and more preferably 5 μm to 300

μm in an embodiment of the disclosure. Here, the period "a" refers to the distance between the ends of the circles of adjacent dots. The mask layer 4 can be formed by forming a constituent material of the mask layer 4, and then processing the constituent material into a predetermined shape using a known means such as photolithography. Examples of the constituent material of the mask layer 4 include oxides, nitrides or carbides of Si, Ge, Ti, Zr, Hf, Ta, Sn, Al, for example, carbon, diamond, metal, or mixtures thereof. Further, the deposition methods of the mask layer 4 is not particularly limited, and may be a known means. Examples of the deposition means of the material constituting the mask layer 4 include a vacuum evaporation method, a CVD method, and a sputtering method.

Figure 4:
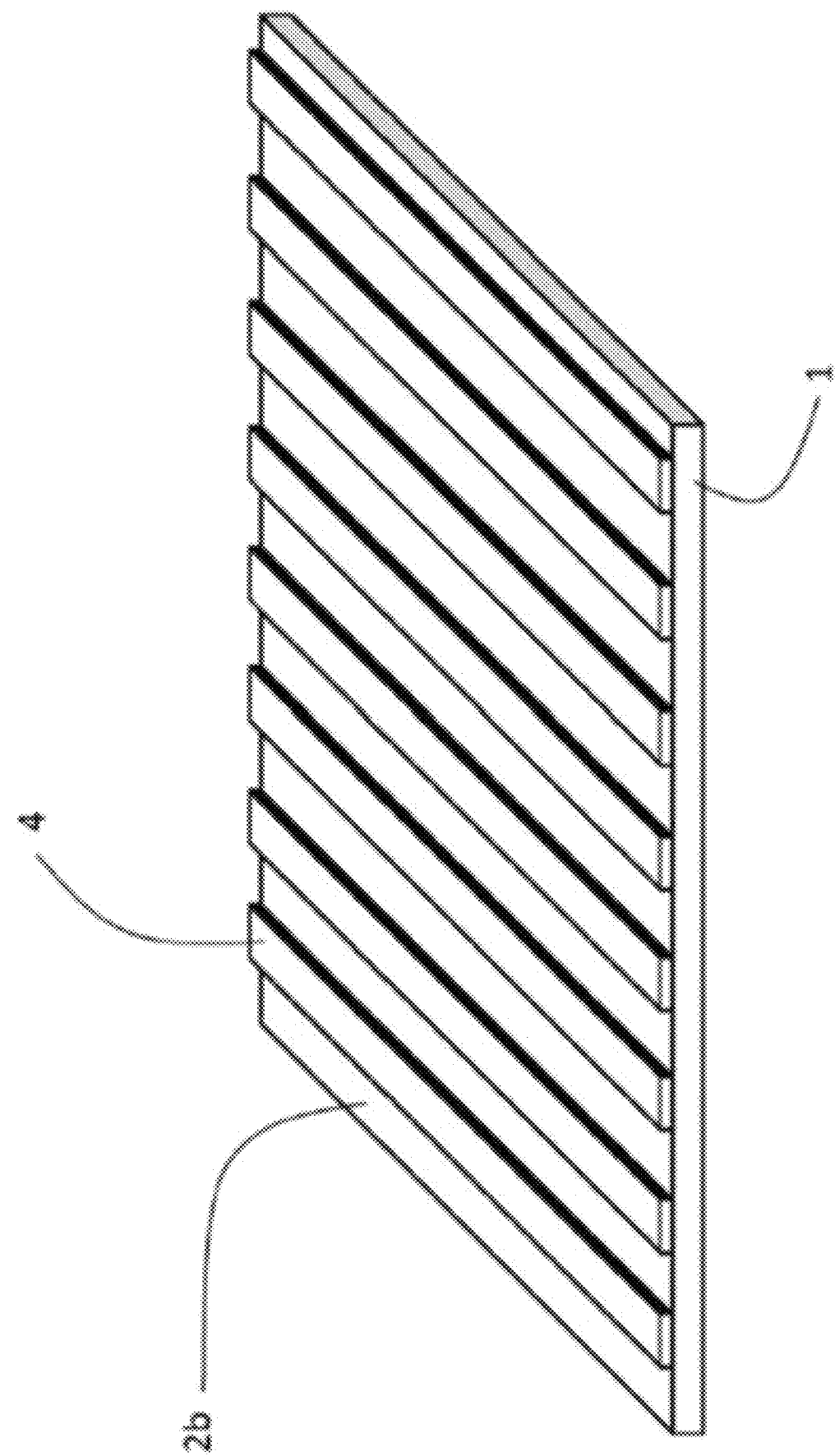
FIG. 4 is a schematic view illustrating an example of the concavities and convexities portion formed on the surface of the substrate used in the embodiment of the disclosure.

FIG. 4 shows one mode of the unevenness portion provided on the crystal growth surface of the crystalline substrate in an embodiment of the disclosure. The unevenness portion in FIG. 4 includes a crystalline substrate 1 and a mask layer 4. The mask layer 4 is formed in a stripe shape on the crystal growth plane of the crystalline substrate 1, and the concavity portion (groove) 2b is formed in a stripe shape by the mask layer 4. The mask layer 4 can be formed by a known means such as photolithography. Examples of the constituent material of the mask layer 4 include oxides, nitrides or carbides of Si, Ge. Ti, Zr, Hf, Ta, Sn, Al, carbon, diamond, metal, or mixtures thereof.

The width and height of the convexities (mask layer) of the unevenness portion, the width and depth of the concavities, the interval, and the like are not particularly limited, but in an embodiment of the disclosure, the width of the convexities (mask layer) is preferably from about 1 μm to about 1 mm, more preferably from about 5 μm to about 300 μm, and most preferably from about 10 μm to about 100 μm. In an embodiment of the disclosure, the height of the convexities (mask layer) is preferably from about 1 nm to about 10 μm, more preferably from about 5 nm to about 1 μm, and most preferably from about 10 nm to about 100 nm. In an embodiment of the disclosure, the width of the recess is preferably from about 1 μm to about 300 μm, more preferably from about 3 μm to about 100 μm, and most preferably from about 5 μm to about 50 μm. In an embodiment of the disclosure, the depth of the concavities is preferably from about 1 nm to about 1 mm, more preferably from about 10 nm to about 300 μm, and most preferably from about 20 nm to about 100 μm. By making the unevenness portion preferred as described above, it is possible to obtain an improved crystalline film more easily. The unevenness portion may be formed directly on the crystalline substrate or may be provided with another layer interposed therebetween.

The methods for crystal growth are not particularly limited, and may be a known means. The crystal growing means may be chosen from CVD method, MOCVD method, MOVPE method, mist-CVD method, mist-epitaxy method, MBE method, HVPE method, pulse-growth method, ALD method and sputtering method, for example. In an embodiment of the disclosure, the crystal growing means is preferable a mist CVD method, a mist epitaxy method, or a HVPE method, and more preferably a HVPE method.

Embodiments of the disclosure will be described in more detail below by exemplifying a case where a HVPE method is sued as the crystal growing means. Specifically, the HVPE method generates a $GaCl_3$ gas by gasifying a metallic source containing gallium, for example, and then optionally reacting it with HCl gas if desired. Then, the $GaCl_3$ gas and the oxygen-containing raw material gas are supplied to the crystalline substrate in the reaction chamber. At this time, it is preferable that the reactive gas is also supplied onto the crystalline substrate and the deposition is performed under the flow of the reactive gas.

(Metal Source)

The metal source is not particularly limited as long as it contains gallium and it can be gasified, and may be an elemental metal or a metal compound. In an embodiment of the disclosure, the metal source is most preferably a simple substance of gallium. Further, the metal source may be a gas, a liquid, or a solid. In an embodiment of the disclosure, it is preferable that the metal source is a liquid phase.

The method for gasification is not particularly limited as long as it does not deviate the object of the disclosure, and may be a known means. In an embodiment of the disclosure, it is preferable that the means for gasification is performed by halogenating the metal source. The halogenating agent used for the halogenation is not particularly limited as long as the metal source can be halogenated, and may be a known halogenating agent. Examples of the halogenating agent include halogen or hydrogen halide. Examples of the halogen include fluorine, chlorine, bromine, or Iodine. Examples of the hydrogen halide include hydrogen fluoride, hydrogen chloride, hydrogen bromide, and hydrogen iodide. In an embodiment of the disclosure, hydrogen halide is preferably used for the halogenation, and hydrogen chloride is more preferably used. In an embodiment of the disclosure, it is preferable that the production of gas is performed by supplying halogen or hydrogen halide as a halogenating agent to the metal source to react the metal source with halogen or hydrogen halide at a temperature higher than or equal to the vaporization temperature of the metal halide to form a metal halide. Although there is no particular limitation on the reaction temperature of halogenation, in an embodiment of the disclosure, when the metal source is gallium and the halogenating agent is HCl, for example, it is preferably 900° C. or less, more preferably 700° C. or less, and most preferably 400° C. to 700° C. The metal halide gas is not particularly limited as long as it is a gas containing gallium halide of the metal source. Examples of the metal halide gas include halides of gallium (fluoride, chloride, bromide, iodide, and the like).

In an embodiment of the disclosure, the metallic source containing gallium is gasified to form a $GaCl_3$ gas, and then $GaCl_3$ gas and the oxygen-containing source gas are supplied onto the substrates in the reactor chamber. Thereby, it is possible to perform the crystal growth under an oxygen-containing atmosphere. In an embodiment of the disclosure, the metallic source containing gallium may be gasified as a $GaCl_3$ gas, and HCl gas may be reacted with, for example, HCl gas to be supplied onto the substrate as $GaCl_3$. In addition, in an embodiment of the disclosure, it is preferable to supply a reactive gas onto the substrate. Although there is no particular limitation on the deposition temperature of the crystalline layer, in an embodiment of the disclosure, when the metal source is gallium and the halogenating agent is HCl, for example, it is preferably 900° C. or less, more preferably 700° C. or less, and most preferably 400° C. to 700° C. As the oxygen-containing raw material gases, one or more gases are selected from $O_2$ gases, $CO_2$ gases, NO gases, $NO_2$ gases, $N_2O$ gases, $H_2O$ gases and $O_3$ gases, for example. In the embodiment of the disclosure, the oxygen-containing raw material gas is preferably one or more gases selected from $O_2$, $H_2O$ and $N_2O$, and more preferably $O_2$. By applying such a preferable oxygen-containing raw material gas, even when a quartz tube is used, for example, it is possible to further suppress the incorporation of Si and to easily obtain a crystalline oxide film having better quality.

The reactive gas is usually a reactive gas different from the metal halide gas and the oxygen-containing raw material gas, and an inert gas is excepted. The reactive gas is not particularly limited, and an etching gas is selected, for example. The etching gas is not particularly limited as long as it does not deviate the object of the disclosure, and may be a known etching gas. In an embodiment of the disclosure, the reactive gas is preferably a halogen gas (such as fluorine gas, chlorine gas, bromine gas or Iodine gas), a hydrogen halide gas (such as fluoric acid gas, hydrochloric acid gas, hydrogen bromide gas or hydrogen iodide gas), a hydrogen gas or a mixed gas of two or more thereof, and preferably contains hydrogen halide gas, and most preferably contains hydrogen chloride. The metal halide gas, the oxygen-containing raw material gas, and the reactive gas may contain a carrier gas. Examples of the carrier gas include an inert gas such as nitrogen or argon. Although the partial pressure of the metal halide gas is not particularly limited, in an embodiment of the disclosure, the partial pressure is normally 1 kPa or more. In an embodiment of the disclosure, the partial pressure of the oxygen-containing raw material gas is not particularly limited, but is preferably 0.5 to 100 times, more preferably 1 to 20 times, of the partial pressure of the metal halide gas. In an embodiment of the disclosure, the partial pressure of the reactive gas is also not particularly limited, but is preferably 0.1 times to 5 times, more preferably 0.2 times to 3 times, of the partial pressure of the metal halide gas.

In an embodiment of the disclosure, it is also preferable to supply the dopant-containing raw material gas to the substrate. The dopant-containing raw material gas is not particularly limited as long as it contains a dopant. Although there is no particular limitation on the dopant, in an embodiment of the disclosure, it is preferable that the dopant contains one or more kinds of elements selected from germanium, silicon, titanium, zirconium, vanadium, niobium and tin, more preferably germanium, silicon, or tin, and most preferably germanium. By using the dopant-containing source gas in this manner, the electric conductivity of the obtained film can be easily controlled. The dopant-containing raw material gas preferably has the dopant in the form of a compound (such as a halide and an oxide), more preferably in the form of a halide. The partial pressure of the dopant-containing raw material gas is not particularly limited, but in an embodiment of the disclosure, it is preferable that the partial pressure of the dopant-containing raw material gas is $1\times10^{-7}$ times to 0.1 times, of the partial pressure of the metal-containing raw material gas, and more preferably $2.5\times10^{-6}$ times to $7.5\times10^{-2}$ times. In an embodiment of the disclosure, it is preferable that the dopant-containing raw material gas is supplied onto the substrate together with the reactive gas.

(Crystalline Film)

The crystalline film is preferably a crystalline oxide film, and is preferably a crystalline film containing a crystalline metal oxide containing gallium as a main component. Content of Si in the crystalline film is preferably $2\times10^{15}$ cm$^{-3}$ or less. In an embodiment of the disclosure, it is preferable that the crystalline film contains a single crystal of the crystalline metal oxide as a main component. In an embodiment of the disclosure, the crystalline oxide may be a semiconductor. Examples of the crystalline oxide include crystals of a metal oxide containing one or more kinds of metals selected from aluminum, gallium, indium, iron, chromium, vanadium, titanium, rhodium, nickel, cobalt, and iridium. In an embodiment of the disclosure, it is preferable that the crystalline oxide contains at least one kind of metal selected from aluminum, indium and gallium, more preferably at least gallium, and most preferably a crystal or a mixed crystal of $Ga_2O_3$. The crystal structure of the crystalline oxide is not particularly limited. The crystal structure of the crystalline oxide includes, for example, the corundum structure, the β-Gallia structure, the hexagonal crystal structure (the ε-type structure, for example), the rectangular crystal structure (the κ-type structure, for example), the cubic crystal structure, or the tetragonal crystal structure. In an embodiment of the disclosure, the crystalline oxide preferably has the corundum structure, the β-Gallia structure, or the hexagonal crystal (the ε-type structure, for example), and more preferably has the corundum structure. The term "main component" means that the crystalline oxide is preferably contained in an atomic ratio of 50% or more, more preferably 70% or more, and still more preferably 90% or more, based on all components of the crystalline film (crystalline oxide layer), and may be 100%. The thickness of the crystalline film (crystalline oxide layer) is not particularly limited, but is preferably 10 μm or more, more preferably 25 μm or more, and most preferably 50 μm or more. The surface area of the crystalline film is not particularly limited, but is preferably 10 cm$^2$ or more, and more preferably 20 cm$^2$ or more.

A dopant may be contained in the crystal film. The dopant is not particularly limited and may be a known material, and may be an n-type dopant or a p-type dopant. Examples of the n-type dopant include tin, germanium, silicon, titanium, zirconium, vanadium, niobium, or two or more of these elements. Examples of the p-type dopant include Mg, H, U, Na, K, Rb, Cs, Fr, Be, Ca, Sr, Ba, Ra, Mn, Fe, Co, Ni, Pd, Cu, Ag, Au, Zn, Cd, Hg, Ti, Pb, N, P, or two or more of these elements. The content of the dopant is also not particularly limited, but is preferably 0.00001 atomic % or more, more preferably 0.00001 atomic % to 20 atomic %, and most preferably 0.00001 atomic % to 10 atomic % in the crystalline layer.

The crystalline film according to an embodiment of the disclosure can be suitably applied to semiconductor devices, and is particularly useful for power devices. Semiconductor devices provided using the crystalline layer include MIS, transistors such as HEMT and MOS, TFT, Schottky barrier diodes utilizing semiconductor-metal junctions, PN or PIN diodes combined with other p-layers, and light-receiving devices.

In an embodiment of the disclosure, the crystalline film may be used as it is together with the substrate in a semiconductor device or the like, or may be applied to a semiconductor device or the like after separation from the substrate and the like using a known means. In addition to the above, the semiconductor device is suitably used as a power module, an inverter, or a converter using known means, and these semiconductor devices are also included in the present invention. The semiconductor device according to an embodiment of the disclosure is suitably used for a semiconductor system employing a power supply apparatus, for example.

Figure 9:
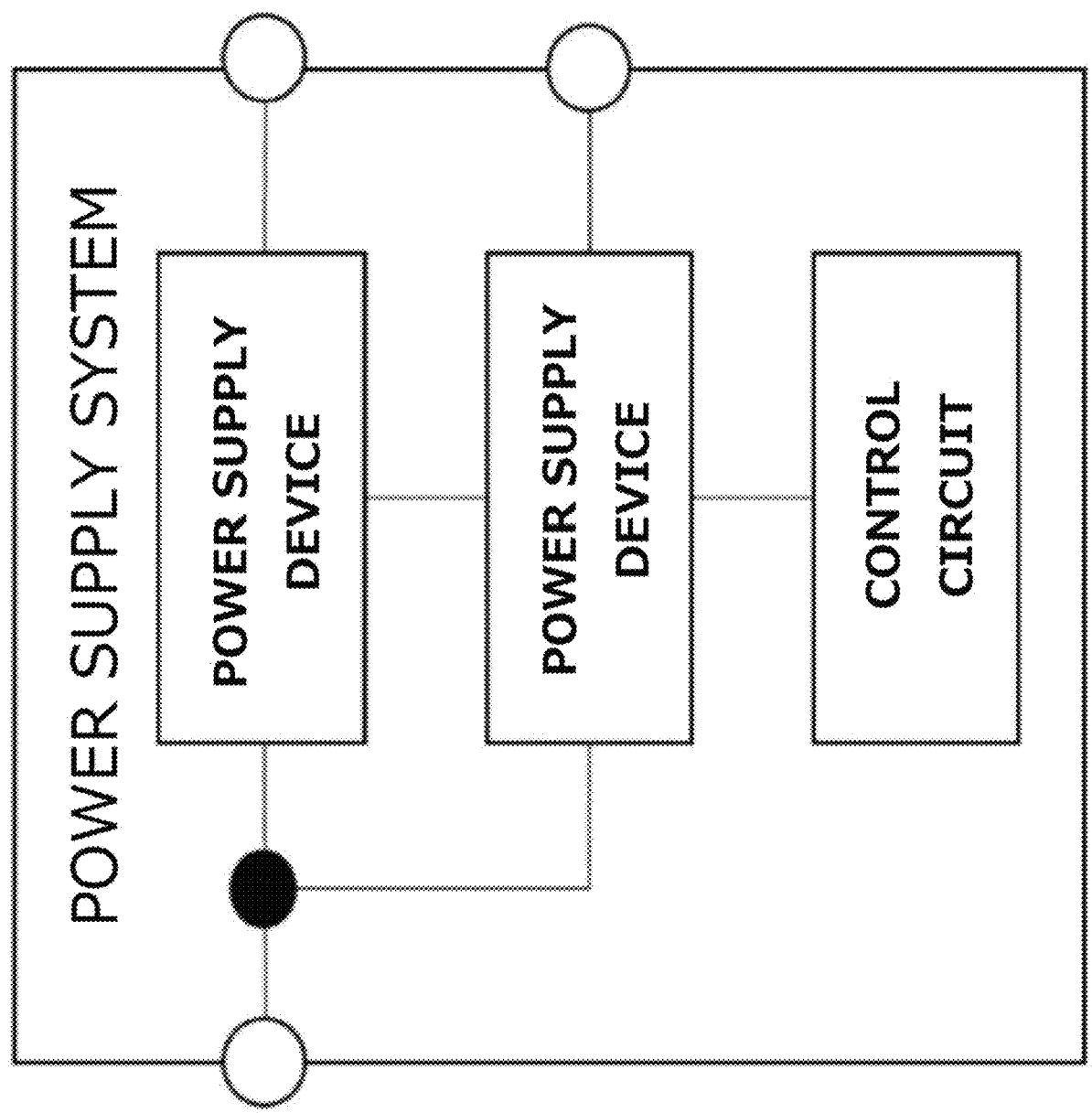
FIG. 9 is a schematic diagram illustrating an embodiment of a power supply system.
Figure 10:
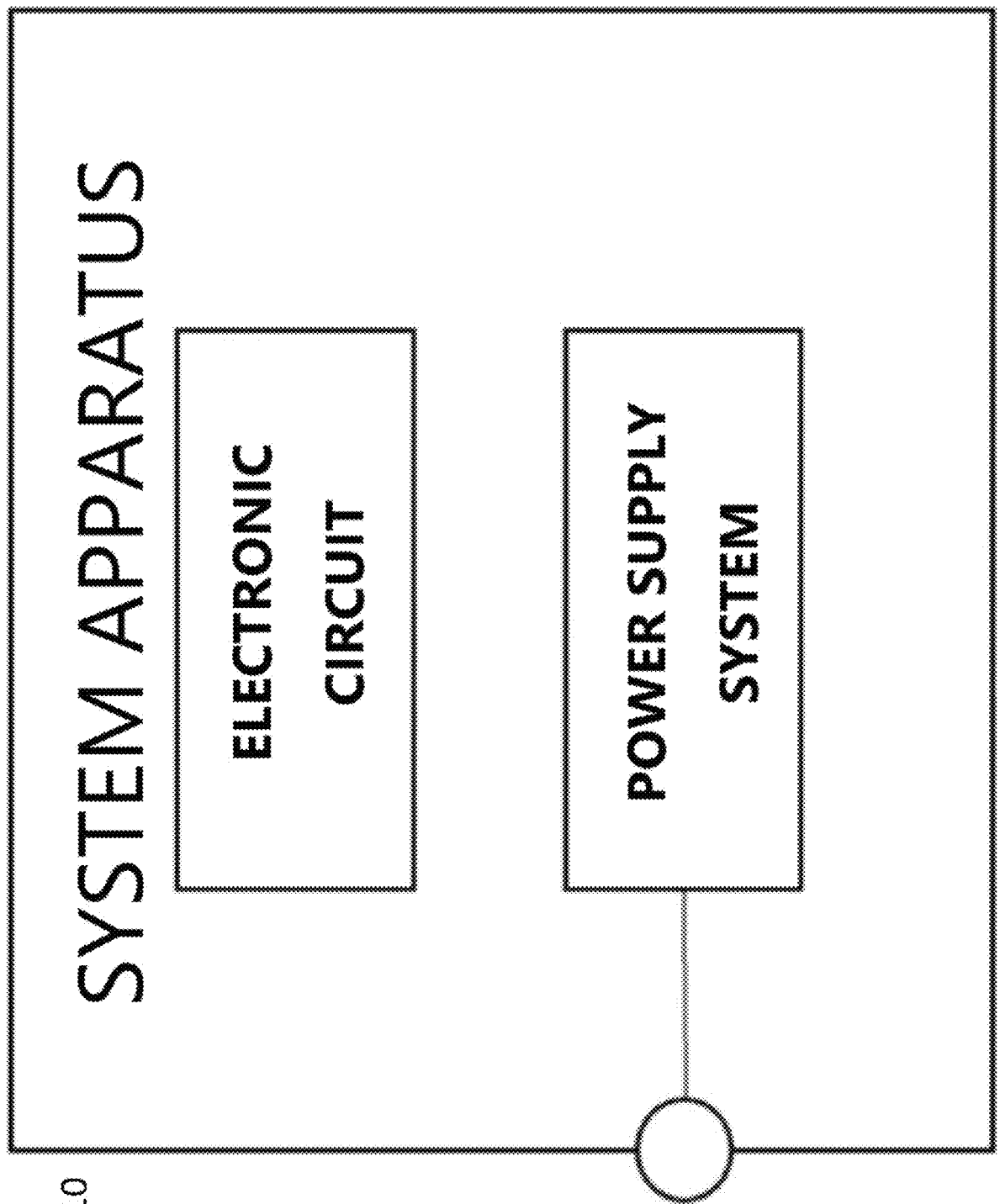
FIG. 10 is a diagram schematically illustrating an example of a system device.

The power supply apparatus can be manufactured from the semiconductor device by connecting to a wiring pattern by a known means, or can be manufactured as the semiconductor device. FIG. 9 shows an example of a power supply system. The power supply system illustrated in FIG. 9 constitutes a plurality of the power supply apparatus and a control circuit. As shown in FIG. 10, the power supply system can be applied to a system apparatus in combination with electronic circuit. An example of a power supply circuit diagram of the power supply apparatus is illustrated in FIG.

Figure 11:
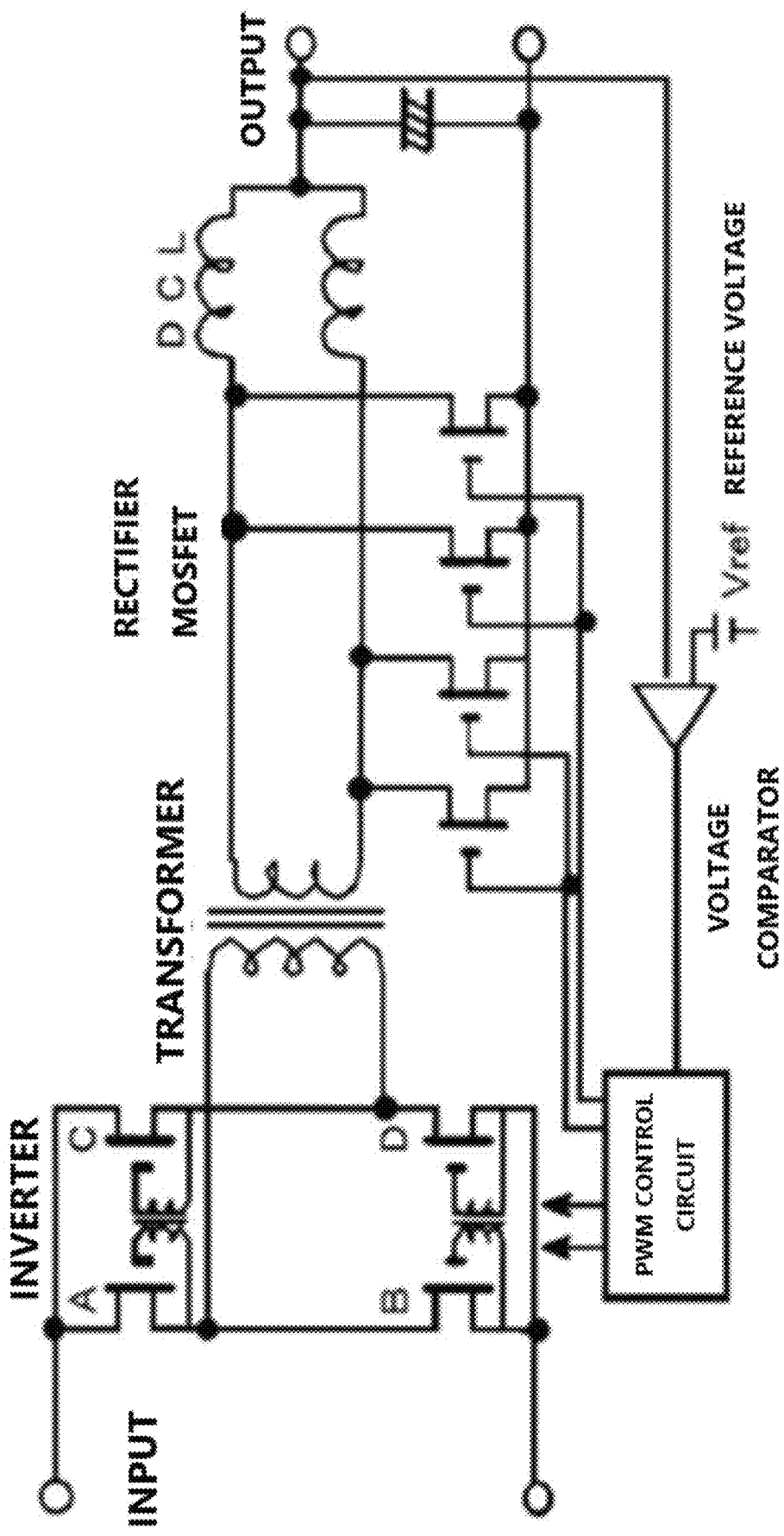
FIG. 11 is a schematic diagram illustrating an embodiment of a power supply circuit diagram of a power supply apparatus.

11. FIG. 11 shows a power supply circuit of a power supply unit composed of a power circuit and a control circuit. A DC voltage is switched at a high frequency by an inverter (shown as A to D in MOSFET) and converted to AC voltage, insulated, and transformed by a transformer, rectified by a rectification MOSFET, and then smoothed by a DCL (smoothing coils) and a capacitor to output a DC voltage. A voltage comparator is used to compare the output voltage with the reference voltage, and a PWM control circuit is used to control the inverter and the rectifier MOSFET to a desired output voltage.

EXAMPLES

Hereinafter, examples of the present invention will be described. Note that the present invention is not limited thereto.

Example 1

1. Formation of ELO Masks

As a substrate, a sapphire substrate (c-plane, off-angle 0.25°) having an α-$Ga_2O_3$ layer formed on its surface was used, and a mask layer containing SiO2 was formed on the substrate by a sputtering method. Then, using a photolithography method, the formed mask layer was processed into a mask of a predetermined shape. Specifically, the mask layer is processed by openings (dots) (diameter: 5 μm) to be arranged on the substrate in a triangular lattice shape at a period of 5 μm (distance between the ends of adjacent dots).

2. Formation of Crystalline Films 2-1. HVPE Apparatus

A halide vapor deposition epitaxy (HVPE) apparatus 50 used in this example will be described with reference to FIG. 1. The HVPE apparatus 50 includes a reaction chamber 51, a heater 52a for heating a metal source 57, and a heater 52b for heating the substrate fixed to a substrate holder 56. Further, an oxygen-containing raw material gas supply pipe 55b, a reactive gas supply pipe 54b, and the substrate holder 56 for installing the substrate are provided in the reaction chamber 51. The reactive gas supply pipe 54b has a double tube structure provided with a supply gas tube 54b therein for supplying a metal-containing raw material gas (metal halide gas). An oxygen-containing raw material gas supply pipe 55b is connected to an oxygen-containing raw material gas supply source 55a. A flow path of the oxygen-containing raw material gas is configured so that the oxygen-containing raw material gas can be supplied from the oxygen-containing raw material gas supply source 55a to the substrate fixed to the substrate holder 56 via the oxygen-containing raw material gas supply pipe 55b. The reactive gas supply pipe 54b is connected with a reactive gas supply source 54a. A flow path of the reactive gas is constituted so that the reactive gas can be supplied from the reactive gas supply source 54a to the substrate fixed to the substrate holder 56 via the reactive gas supply pipe 54b. The metal-containing raw material gas supply pipe 53b is connected with a halogen-containing raw material gas supply source 53a. The halogen-containing raw material gas is supplied to the metal source to generate the metal-containing raw material gas, and the metal-containing raw material gas is supplied to the substrate fixed to the substrate holder 56. The reaction chamber 51 is provided with a gas discharge portion 59 for exhausting used gas. The inner wall of the reaction chamber 51 is provided with a protective sheet 58 which prevents the reactants from precipitating.

2-2. Preparation for Deposition

A gallium (Ga) metal source 57 (having a purity of 99.99999% or more) was placed inside the metal-containing raw material gas supply pipe 53b. The sapphire substrate with the mask layer thereon obtained in the step 1 described above was placed on the substrate holder 56 in the reaction chamber 51. Thereafter, the heaters 52a and 52b were operated to raise the internal temperature of the reaction chamber 51 to 570° C. (near the gallium metal source) and 520° C. (near the substrate holder).

2-3. Deposition

Hydrogen chloride (HCl) gas (purity 99.999% or more) was supplied from a halogen-containing raw material gas supply source 53a to the gallium metal source 57 placed inside the metal raw material-containing gas supply pipe 53b. Gallium chloride ($GaCl$/$GaCl_3$) was generated by chemical reactions between gallium metal and hydrogen chloride (HCl) gases. The obtained gallium chloride ($GaCl$/$GaCl_3$) and $O_2$ gas (purity 99.99995% or more) supplied from the oxygen-containing source gas supply source 55a were supplied onto a substrate on the substrate holder 56, together with the reactive gas through the reactive gas supply pipe 54b. Then, gallium chloride ($GaCl$/$GaCl_3$) and $O_2$ gas were reacted on the substrate at 520° C. under atmospheric pressure while supplying HCl gas to deposit a film on the substrate. Flow rate (partial pressure) of the HCl gas supplied from the halogen-containing raw material gas supply source 53a was maintained at 1 kPa, flow rate (partial pressure) of the HCl gas supplied from the reactive gas supply source 54a was maintained at 1 kPa, and flow rate (partial pressure) of $O_2$ gas supplied from the oxygen-containing raw material gas supply source 55a was maintained at 2.5 kPa.

2-4. Evaluation

Figure 5:
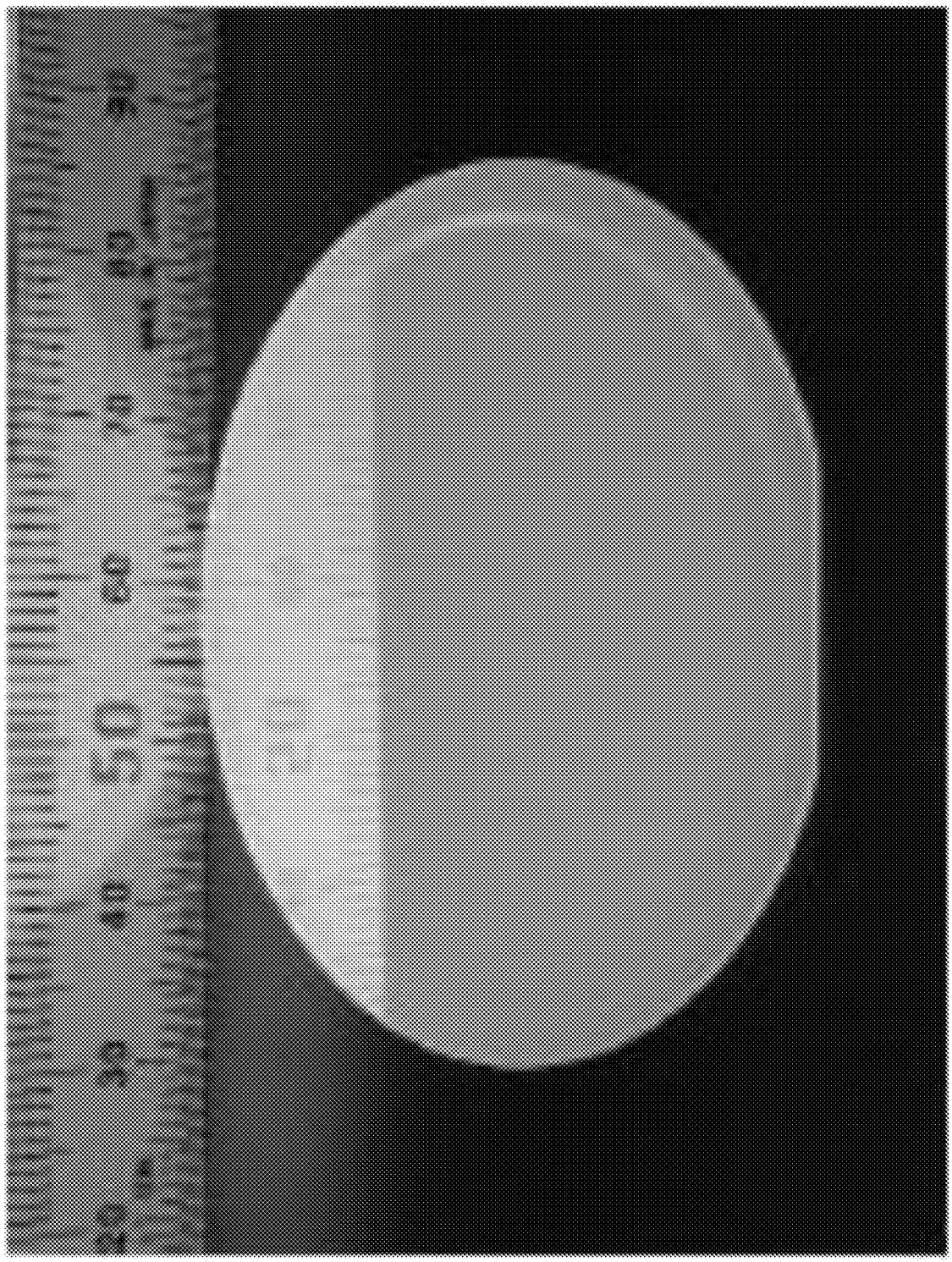
FIG. 5 is a diagram showing a photograph of a crystalline film in an embodiment of the disclosure.
Figure 8:
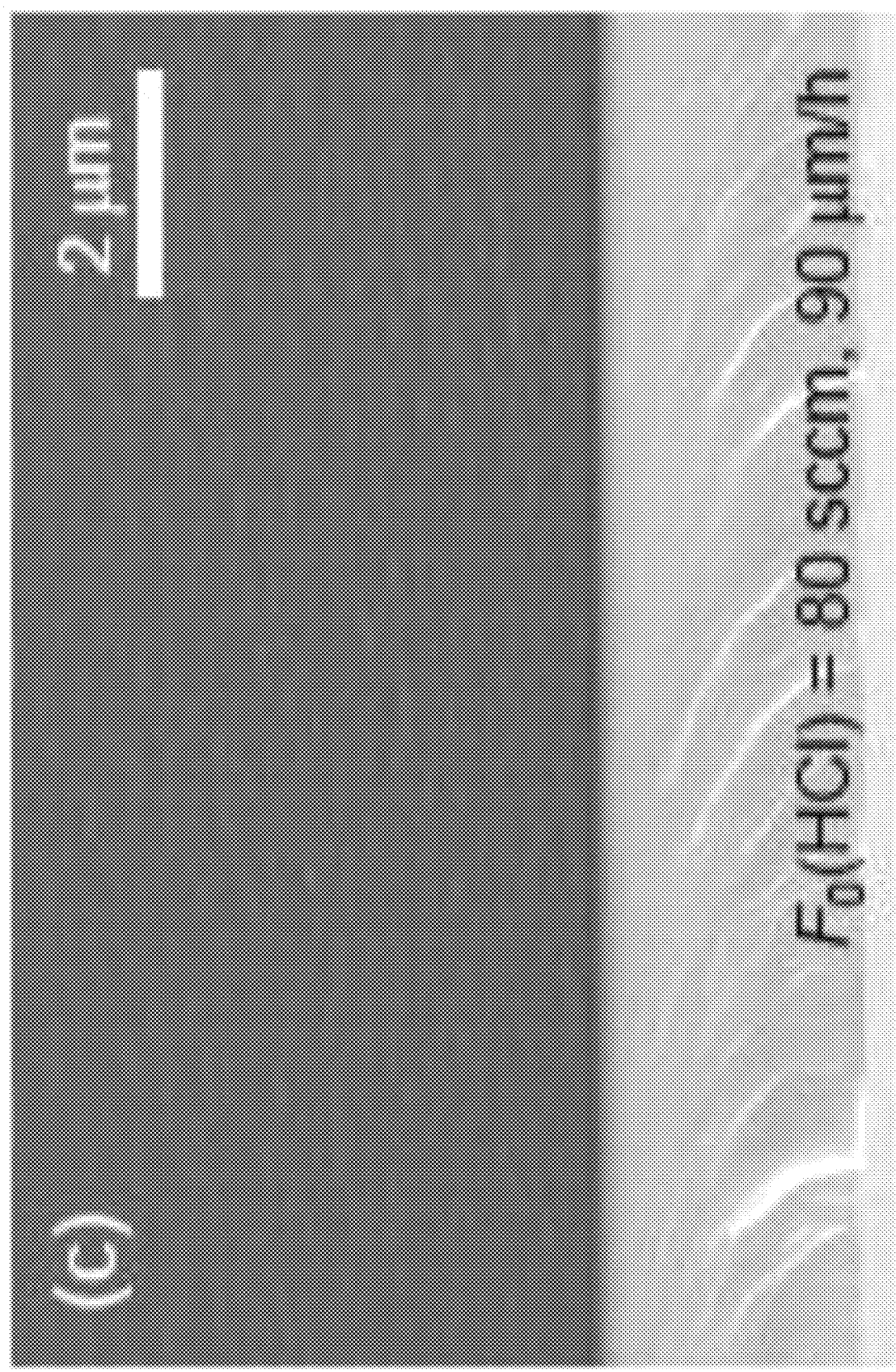
FIG. 8 is a diagram showing SEM observation results in an example.

The crystalline film obtained in the above steps 2-3. was observed by SEM. The results are illustrated in FIG. 8. Further, a photograph of the obtained crystalline film is shown in FIG. 5. The obtained crystalline film was measured by SIMS. The measurement results are shown in Table 1. As is obvious from Table 1, the content of Si and the like was less than that of Comparative Example, and was lower than the detection limit.

TABLE 1

| Element | Measurement Result (/$cm^3$) | Detection Limit (/$cm^3$) |
|---|---|---|
| H | $3 \times 10^{17}$ | — |
| C | lower than detection limit | $5 \times 10^{15}$ |
| N | lower than detection limit | $5 \times 10^{15}$ |
| Si | lower than detection limit | $1 \times 10^{15}$ |
| S | lower than detection limit | $2 \times 10^{15}$ |
| Cl | $1 \times 10^{18}$ | — |

Comparative Example 1

Figure 6:
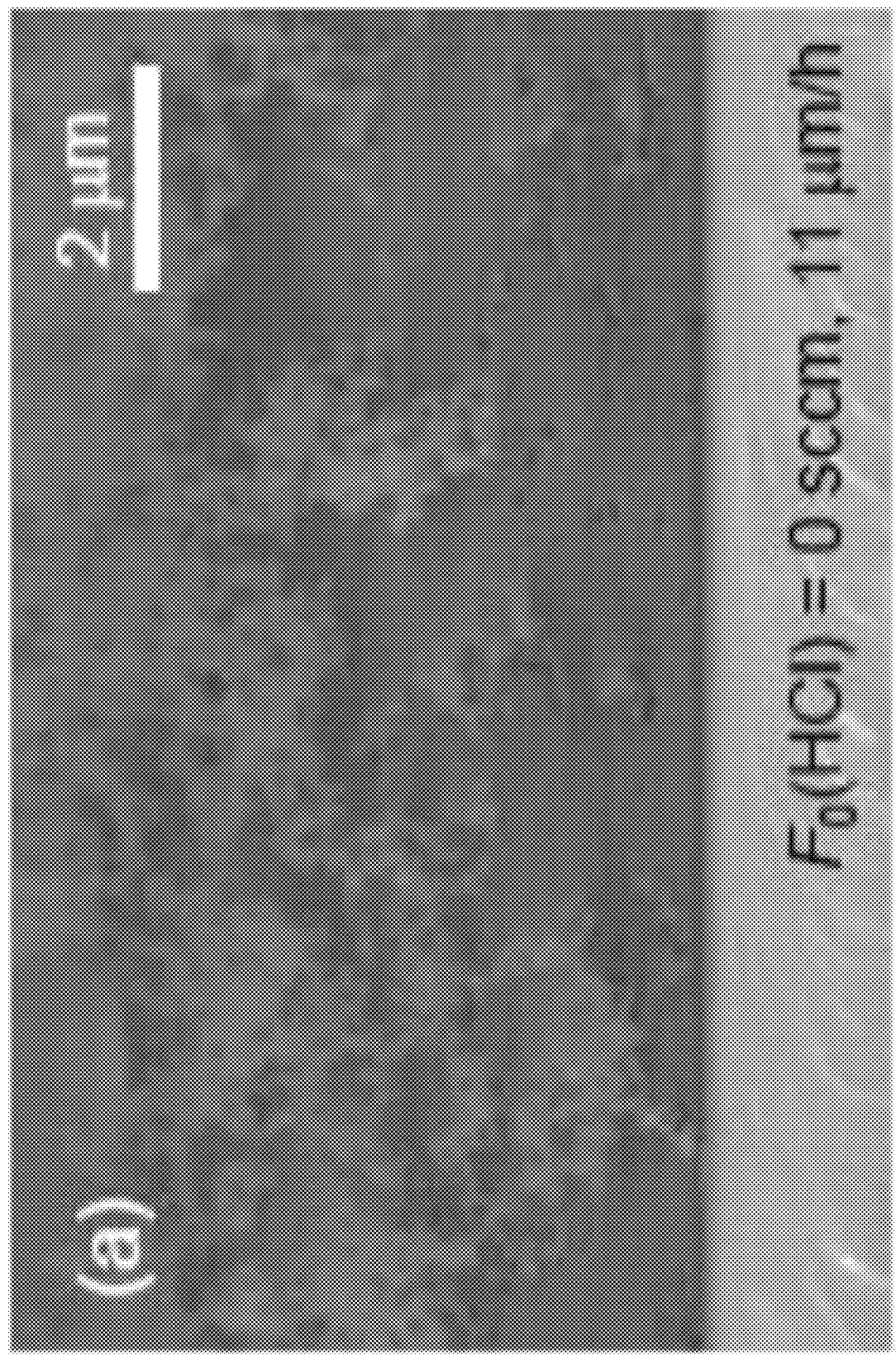
FIG. 6 is a diagram showing SEM observation results in a comparative example.

Except for the conditions shown in Table 2, a crystalline film for Comparative Example 1 was produced in the same manner as in Example 1. The obtained crystalline film was observed by SEM. The results are shown in FIG. 6.

Comparative Example 2

Figure 7:
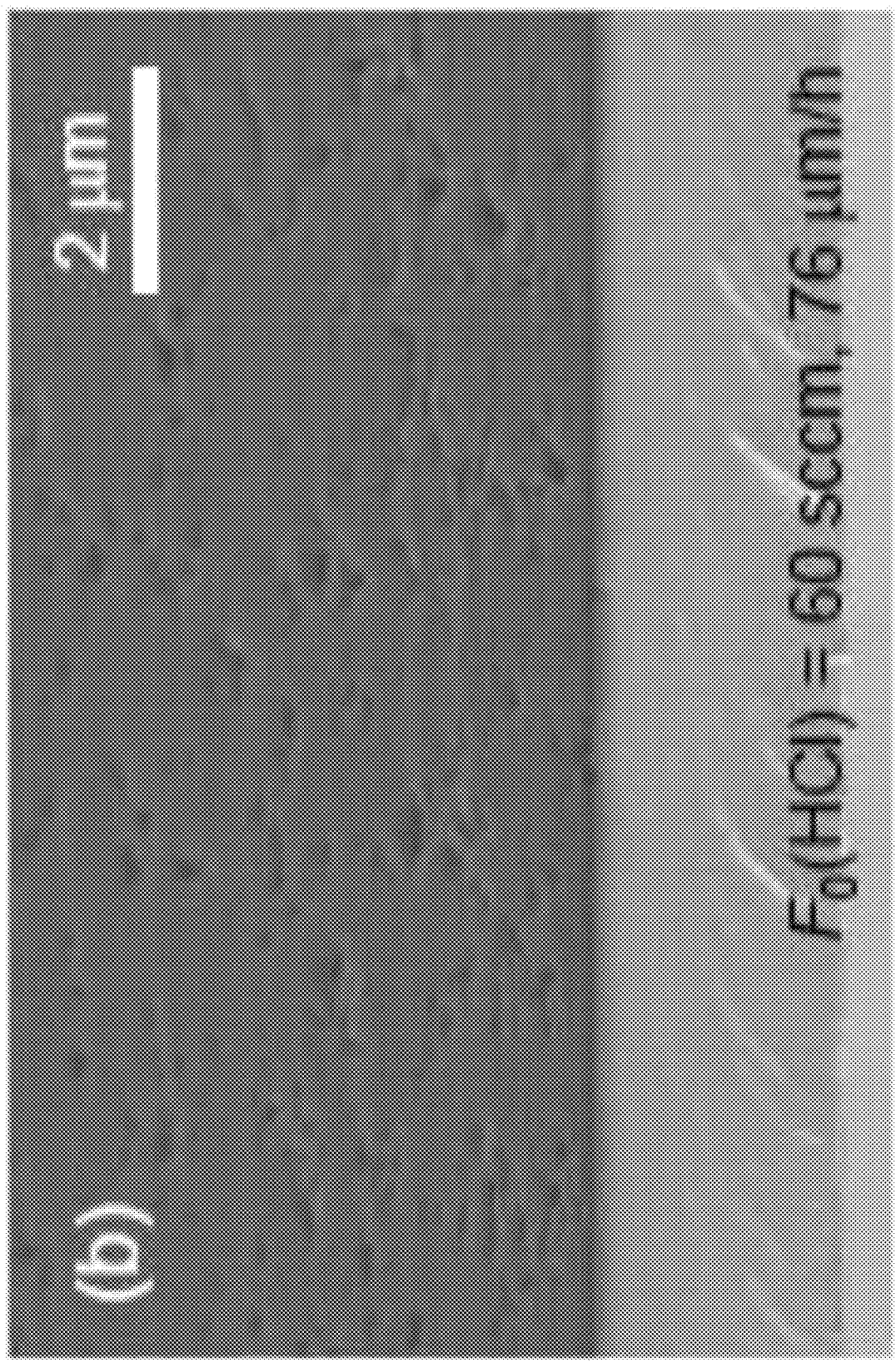
FIG. 7 is a diagram showing SEM observation results in a comparative example.

Except for the conditions shown in Table 2, a crystalline film for Comparative Example 2 was produced in the same manner as in Example 1. The obtained crystalline film was observed by SEM. The results are shown in FIG. 7.

TABLE 1

| | Partial Pressure of Halogen-containing Raw Material Gas | Deposition Speed (μm/hour) |
|---|---|---|
| Example 1 | 1 | 90 |
| Comparative Example 1 | 0 | 11 |
| Comparative Example 2 | 0.75 | 76 |

The crystalline film and the manufacturing method thereof according to the embodiments of the disclosure can be used in all fields such as semiconductors (such as compound semiconductor electronic devices), electronic components and electrical equipment components, optical and electrophotographic related devices, and industrial members. In particular, the crystalline film and the method of manufacturing the same according to the embodiments of the disclosure are useful in the field of semiconductor devices, manufacturing thereof and the like.

The invention claimed is:

1. A crystalline film containing a crystalline metal oxide including gallium as a main component,
wherein the crystalline film includes a Si in a content of less than $1 \times 10^{15}$ cm$^{-3}$, and
the crystalline film includes a content of C of $5 \times 10^{16}$ cm$^{-3}$ or less.

2. The crystalline film according to claim 1, wherein the crystalline metal oxide has a corundum structure.

3. The crystalline film according to claim 1, wherein the thickness of the crystalline film is 10 μm or more.

4. The crystalline film according to claim 1, wherein the thickness of the crystalline film is 25 μm or more.

5. The crystalline film according to claim 1, wherein the surface area of the crystalline film is 10 cm$^2$ or more.

6. The crystalline film according to claim 1, wherein the crystalline film is a semiconductor film.

7. The crystalline film according to claim 1, wherein the Si is not a dopant.

8. A semiconductor device including a crystalline film containing a crystalline metal oxide including gallium as a main component,
wherein the crystalline film includes a Si in a content of less than $1 \times 10^{15}$ cm$^{-3}$, and
the crystalline film includes a content of C of $5 \times 10^{16}$ cm$^{-3}$ or less.

9. The semiconductor device according to claim 8, wherein the semiconductor device is a power device.

10. A semiconductor system comprising a semiconductor device including a crystalline film containing a crystalline metal oxide including gallium as a main component,
wherein the crystalline film includes a Si in a content of less than $1 \times 10^{15}$ cm$^{-3}$, and
the crystalline film includes a content of C of $5 \times 10^{16}$ cm$^{-3}$ or less.

11. A method for manufacturing a crystalline film for depositing a crystalline film on a substrate by crystal growth from a raw material, wherein the raw material contains GaCl$_3$, and wherein the crystal growth is performed under a condition in which a partial pressure of the raw material is 1 kPa or more and an atmosphere containing oxygen, and wherein the crystalline film deposited on the substrate includes a Si in a content of less than $1 \times 10^{15}$ cm$^{-3}$.

12. The manufacturing method according to claim 11, wherein the crystal growth is performed by a HVPE method.

13. The manufacturing method according to claim 11, wherein the crystal growth is performed at a deposition rate of 90 μm/hour or more.

14. The manufacturing method according to claim 11, wherein the crystal growth is performed under a temperature of 400° C. to 700° C.

15. The manufacturing method according to claim 11, wherein the crystal growth is performed by forming an unevenness portion including concavities and/or convexities on the substrate directly or via another layer, and then forming the crystalline film on the unevenness portion.

16. The manufacturing method according to claim 15, wherein the unevenness portion is formed by arranging a mask regularly on the substrate directly or via another layer.

17. The manufacturing method according to claim 11, wherein the substrate is a sapphire substrate.

18. The manufacturing method according to claim 11, wherein the crystalline film is a crystalline oxide film.

19. The manufacturing method according to claim 18, wherein the crystalline oxide film includes a crystal or a mixed crystal of Ga$_2$O$_3$.

20. The manufacturing method according to claim 18, wherein the crystalline oxide film has a corundum structure.

21. The manufacturing method according to claim 11, wherein the crystal growth is performed under a gas flow of a gas including hydrogen.

* * * * *